United States Patent
Marszal

(10) Patent No.: US 6,770,178 B2
(45) Date of Patent: Aug. 3, 2004

(54) CATHODIC ARC DISPOSABLE STING SHIELDING

(75) Inventor: Dean N. Marszal, Southington, CT (US)

(73) Assignee: United Technologies Corporation, Hartford, CT (US)

( * ) Notice: Subject to any disclaimer, the term of this patent is extended or adjusted under 35 U.S.C. 154(b) by 48 days.

(21) Appl. No.: 10/217,241

(22) Filed: Aug. 9, 2002

(65) Prior Publication Data

US 2004/0026242 A1 Feb. 12, 2004

(51) Int. Cl.$^7$ ................................................ C23C 14/32
(52) U.S. Cl. .............................. 204/298.41; 204/192.38
(58) Field of Search ........................ 204/192.38, 290.41

(56) References Cited

U.S. PATENT DOCUMENTS 3,793,179 A * 2/1974 Sablev et al. .......... 204/298.41
5,269,896 A * 12/1993 Munemasa et al. ..... 204/192.38
6,036,828 A * 3/2000 Beers et al. ........... 204/298.41

* cited by examiner

Primary Examiner—Rodney G. McDonald
(74) Attorney, Agent, or Firm—Bachman & LaPointe, P.C.

(57) ABSTRACT

A shielding arrangement is described for a cathodic arc deposition apparatus which includes a contactor formed from an electrically conductive material and having an axially extending shaft and a cathode. The shielding arrangement includes a cup formed from an electrically conductive material surrounding a portion of the contactor shaft and a shield for preventing material from being deposited on the cup. The shielding arrangement includes a removable ring shield attached to the cup and a cylindrical shield formed from an electrically non-conductive material surrounding the cup and a portion of the shaft.

18 Claims, 2 Drawing Sheets

CATHODIC ARC DISPOSABLE STING SHIELDING

BACKGROUND OF THE INVENTION

The present invention relates to an improved shielding arrangement for a cathodic arc vapor deposition system.

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in an evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current power supply is attached to the source material (hereinafter referred to as the "cathode") and the positive lead is attached to an anodic member. In many cases, the positive lead is attached to the deposition chamber, thereby making the chamber the anode. An arc initiating trigger, at or near the same potential as the anode, contacts the cathode and subsequently moves away from the cathode. When the trigger is still in close proximity to the cathode, the difference in potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

The energy deposited by the arc at a cathode spot is intense; on the order of $10^5$ to $10^7$ amperes per square centimeter with a duration of a few to several microseconds. The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted toward any object within the deposition chamber having a negative electric potential relative to the positively charged ion. Some deposition processes maintain the substrate to be coated at the same electric potential as the anode. Other processes use a biasing source to lower the potential of the substrate and thereby make the substrate relatively more attractive to the positively charged ions. In either case, the substrate becomes coated with the vaporized material liberated from the cathode. The rate of deposition, the coating density, and the coating thickness can be adjusted to satisfy the needs of the application.

Currently, in production, the arc which is created has a tendency to drift towards the electrical supply and short out the system once vapor deposition takes place. The way this happens is during the coating process, the vapor builds up on various details and creates a path for the arc to follow. Thus, there is needed a way to eliminate or remove the path.

SUMMARY OF THE INVENTION

Accordingly, it is an object of the present invention to provide an improved shielding arrangement for a cathodic arc deposition apparatus.

It is a yet another object of the present invention to provide a shielding arrangement as above which sustains the electrical arc on the cathode for a longer period of time.

The foregoing objects are attained by the shielding arrangement of the present invention.

In accordance with the present invention, a shielding arrangement for use with a cathodic arc deposition apparatus including a contactor formed from an electrically conductive material, which contactor has an axially extending shaft, broadly comprises a cup formed from an electrically conductive material surrounding a portion of the contactor and shield means for preventing material from being deposited on the cup. The shield means, in a first aspect, comprises a removable ring shield attached to the cup. The shield means, in a second aspect, also comprises a shield formed from an electrically non-conductive material surrounding the cup and a portion of the contactor shaft.

Other details of the cathodic arc disposable sting shielding of the present invention, as well as other objects and advantages attendant thereto, are set forth in the following detailed description and the accompanying drawings wherein like reference numerals depict like elements.

DETAILED DESCRIPTION OF THE PREFERRED EMBODIMENT(S)

Figure 1:
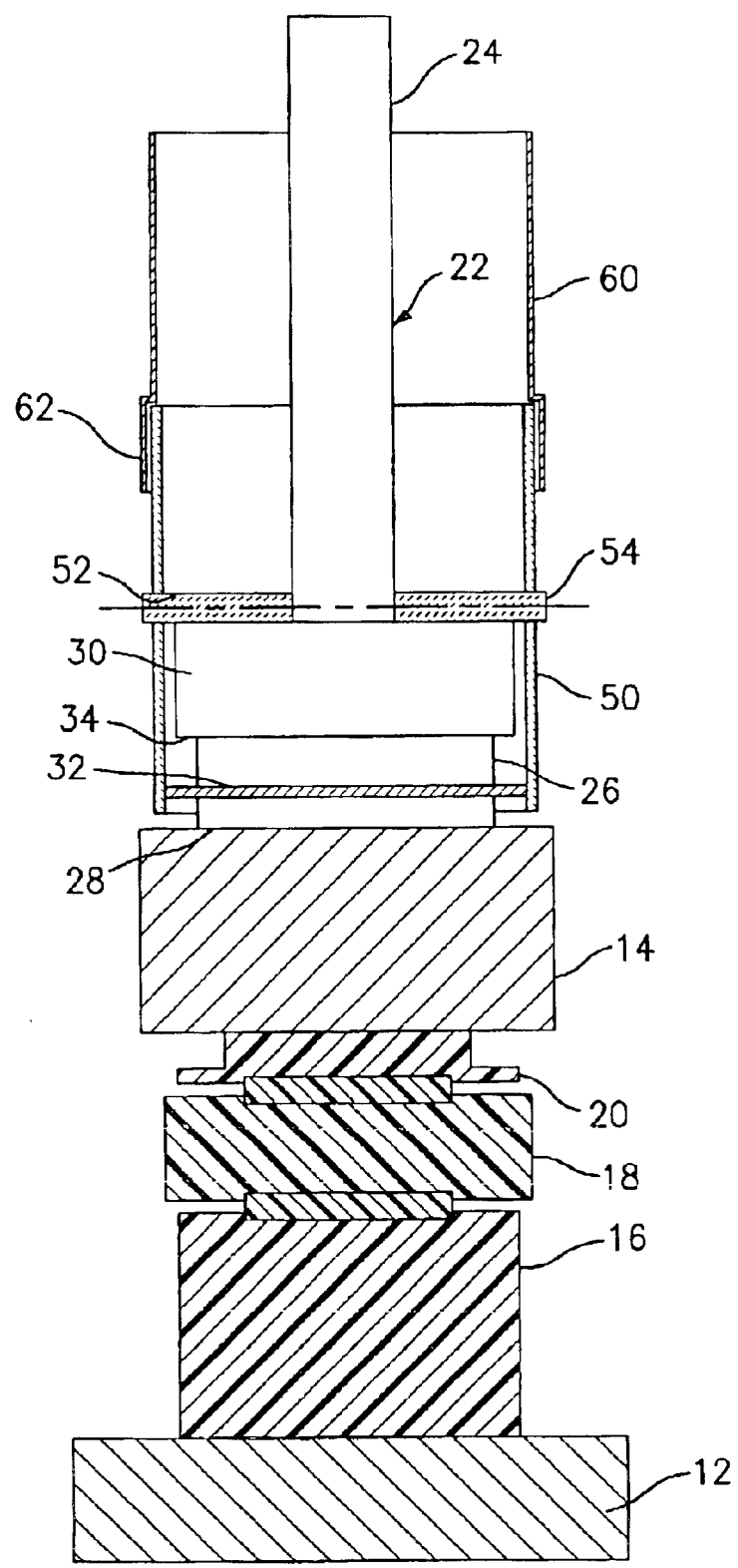
FIG. 1 is a cross sectional view of a shielding arrangement in accordance with the present invention.

Referring now to the drawings, FIG. 1 illustrates a portion of a cathodic arc deposition apparatus having the shielding arrangement of the present invention. As shown therein, the cathodic arc deposition apparatus 10 includes a platter 12 and a cathode 14 supported on the platter 12 by a plurality of stack pieces 16, 18, and 20. The deposition apparatus 10 further includes a contactor 22 having an axially extending shaft 24. The contactor 22 may be formed from any suitable electrically conductive material known in the art and may have the construction shown in U.S. Pat. No. 5,932,078 to Beers et al., which is hereby incorporated by reference herein.

A cup 26 surrounds a portion of the contactor 22 and is connected to the contactor 22 by a flange (not shown). A lower surface 28 of the cup 26 contacts the cathode 14. The cup 26 is preferably formed from an electrically conductive material such as a copper alloy material.

Figure 3:
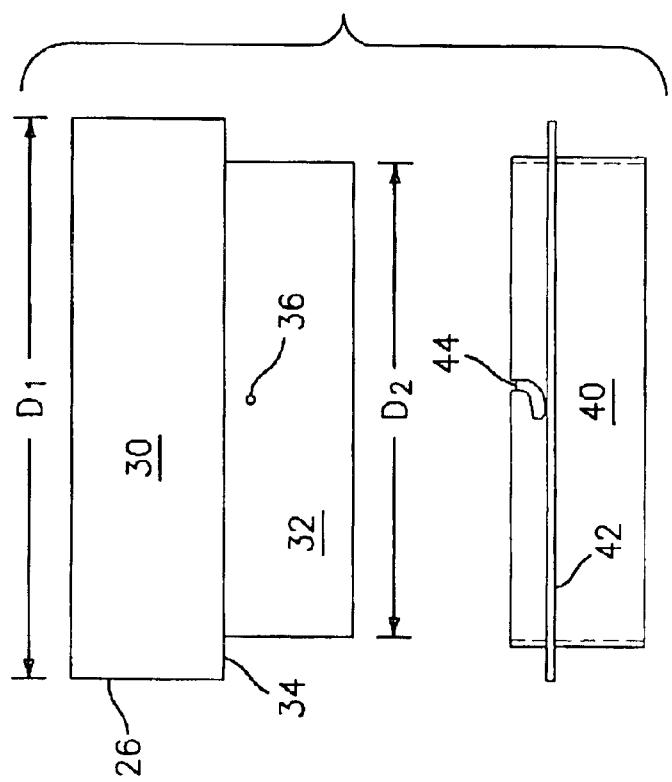
FIG. 3 is an exploded view of the shielding arrangement portion of FIG. 2.
Figure 2:
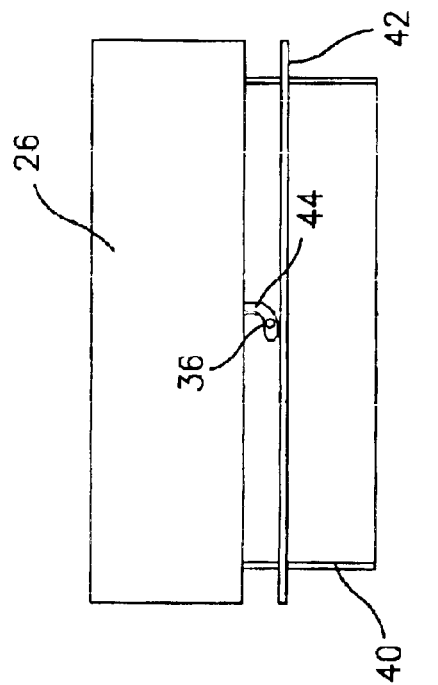
FIG. 2 is a side view of a portion of the shielding arrangement of FIG. 1.

As shown in FIGS. 1–3, the cup 26 has an upper portion 30 and a lower portion 32. The upper portion 30 has a first diameter $D_1$ and the lower portion 32 has a second diameter $D_2$ which is smaller than the first diameter $D_1$. This creates an undercut or lip 34 in the cup 26. The lower portion 32 of the cup 26 has a plurality of attachment members 36, such as pins, integrally formed therewith. The purpose of the attachment members 36 will become clearer from the following description.

In the past, a cup, such as cup 26, would be coated with deposited material, particularly in the area of undercut 34, as a result of the cathodic arc deposition process. The deposition apparatus would have to be shut down periodically to remove the cup so that the deposited material could then be removed. This involved both lost time and great expense to the operator.

In accordance with the present invention, a shielding arrangement is provided which eliminates this problem. The shielding arrangement includes a removable ring shield 40 that surrounds a portion of the cup 26 and is attached thereto by the attachment members 36. The ring shield 40 is preferably formed from a stainless steel material and has a circumferential lip 42 for preventing material from being deposited on the cup 26, particularly in the vicinity of the undercut 34. The circumferential lip may be integrally formed with the ring shield 40 or may be a separate annular piece which surrounds the ring shield 40. To facilitate installation and removal of the ring shield 40, a plurality of spaced apart bayonet slots 44 are formed in the ring shield. The use of the bayonet slots 44 allows the ring shield 40 to be rotated in one direction to an engaged position on the cup 26 and rotated in an opposite direction to a disengaged position which enables it to be removed from the cup 26.

Besides preventing material from being deposited on the cup 26, the ring shield 40 has the advantage of being inexpensive to produce and use. As a result, it can be discarded as needed. The use of the ring shield 40 is beneficial in that it helps avoid the need to remove the cup 26 and avoid lost time.

The shield arrangement of the present invention also includes a cylindrical shield member 50 formed from an electrically non-conductive material, such as a ceramic material. As can be seen in FIG. 1, the shield member 50 surrounds the cup 26 and a portion of the contactor shaft 24. The shield member 50 has a plurality of openings 52 machined therein. The openings 52 receive a plurality of pins 54 for holding the shield member 50 in position. The pins 54 are also formed from an electrically non-conductive material, such as a ceramic material. In use, the pins 54 rest on a surface of the cup 26.

The shielding arrangement of the present invention further includes a telescoping sting shield 60 which abuts and overlaps an end of the cylindrical shield member 50. As can be seen from FIG. 1, the shield 60 has a skirt portion 62 which overlaps a portion of the shield member 50.

The presence of the shield member 50 further prevents material from being deposited on the cup 26 and the shaft 24. Here again, if material is deposited on the shield member 50, it can be easily removed and replaced.

It is apparent that there has been provided in accordance with the present invention a cathodic arc disposable sting shielding which fully satisfies the objects, means, and advantages set forth hereinbefore. While the present invention has been described in the context of specific embodiments thereof, other alternatives, modifications, and variations will become apparent to those skilled in the art having read the foregoing description. Accordingly, it is intended to embrace those alternatives, modifications, and variations that fall within the broad scope of the appended claims.

What is claimed is:

1. A shielding arrangement for a cathodic arc deposition apparatus, which cathodic arc deposition apparatus includes a contactor formed from an electrically conductive material and having an axially extending shaft and a cathode, said shielding arrangement comprising:
   a cup formed from an electrically conductive material surrounding a portion of said shaft;
   shield means for preventing material from being deposited on said cup; and
   said shield means comprising a removable ring shield attached directly to said cup.

2. A shielding arrangement according to claim 1, wherein said ring shield is formed from a stainless steel material.

3. A shielding arrangement according to claim 1, further comprising said ring shield having a circumferential lip.

4. A shielding arrangement according to claim 1, wherein said shield means comprises a sleeve formed from an electrically non-conductive material surrounding said cup.

5. A shielding arrangement according to claim 4, wherein said electrically non-conductive material comprises a ceramic material.

6. A shielding arrangement according to claim 4, wherein said sleeve has a portion which surrounds a portion of said shaft.

7. A shielding arrangement according to claim 4, further comprising a telescoping sting shield positioned around said shaft and abutting an end of said sleeve.

8. A shielding arrangement according to claim 7, wherein said telescoping sting shield has a skirt portion which overlaps a portion of said sleeve.

9. A shielding arrangement for a cathodic arc deposition apparatus, which cathodic arc deposition apparatus includes a contactor formed from an electrically conductive material and having an axially extending shaft and a cathode, said shielding arrangement comprising:
   a cup formed from an electrically conductive material surrounding a portion of said shaft;
   shield means for preventing material from being deposited on said cup;
   said shield means comprises a removable ring shield attached to said cup; and
   said ring shield having a plurality of bayonet slots and said cup having a plurality of attachment members for engaging said slots so as to allow said ring shield to be rotated between engaged and disengaged positions.

10. A shielding arrangement for a cathodic arc deposition apparatus, which cathodic arc deposition apparatus includes a contactor formed from an electrically conductive material and having an axially extending shaft and a cathode, said shielding arrangement comprising:
   a cup formed from an electrically conductive material surrounding a portion of said shaft;
   shield means for preventing material from being deposited on said cup;
   said shield means comprising a sleeve formed from an electrically non-conductive material surrounding said cup;
   said sleeve having a portion which surrounds a portion of said shaft; and
   said sleeve having a plurality of openings in said upper portion and wherein said sleeve is mounted in position via a plurality of pins passing through said openings.

11. A shielding arrangement according to claim 10, wherein said pins are ceramic pins.

12. A cup for use in a cathodic arc deposition apparatus in conjunction with a replaceable ring shield, said cup comprising an upper portion, a lower portion, and a plurality of attachment members integrally formed with said lower portion for supporting said ring shield.

13. A cup according to claim 12, wherein said upper portion has a first diameter and said lower portion has a second diameter less than said first diameter.

14. A cup according to claim 12, wherein said cup is formed from a copper alloy.

15. A disposable ring shield for use in conjunction with a cup member of a cathodic arc deposition apparatus, said ring shield comprising:
   an annular member having a circumferential lip; and means for attaching said annular member directly to said cup.

16. A disposable ring shield according to claim 15, wherein said annular member and said lip are formed from a stainless steel material.

17. A disposable ring shield for use in conjunction with a cup member of a cathodic arc deposition apparatus, said ring shield comprising:

an annular member having a circumferential lip;

means for attaching said annular member to said cup; and said attaching means comprising a plurality of spaced apart bayonet slots.

18. A disposable ring shield according to claim 17, wherein said slots are positioned above said circumferential lip.

\* \* \* \* \*